(12) United States Patent
Tunzini et al.

(10) Patent No.: US 8,531,067 B2
(45) Date of Patent: Sep. 10, 2013

(54) ALTERNATOR WITH SYNCHRONOUS RECTIFICATION EQUIPPED WITH AN IMPROVED ELECTRONIC POWER MODULE

(75) Inventors: Marc Tunzini, Versailles (FR); Fabrice Tauvron, Athis-Mons (FR); Olivier Grammont, Hardelot-Plage (FR); Olivier Danger, Longvilliers (FR); Blaise Rouleau, Clamart (FR); Régis Seidenbinder, Choisy le Roi (FR); Victor Dos Santos, Antony (FR)

(73) Assignee: Valeo Equipments Electriques Moteur, Creteil Cedex (FR)

( * ) Notice: Subject to any disclaimer, the term of this patent is extended or adjusted under 35 U.S.C. 154(b) by 298 days.

(21) Appl. No.: 12/828,560

(22) Filed: Jul. 1, 2010

(65) Prior Publication Data

US 2011/0127888 A1 Jun. 2, 2011

(30) Foreign Application Priority Data

Jul. 3, 2009 (FR) ...................................... 09 54588

(51) Int. Cl.
*H02K 11/00* (2006.01)
*H02K 11/04* (2006.01)

(52) U.S. Cl.
CPC .................................. *H02K 11/046* (2013.01)
USPC ............ 310/68 D; 310/64; 310/68 B; 310/71

(58) Field of Classification Search
CPC .................................................. H02K 11/046
USPC .......................................... 310/64, 86 D, 71
IPC ...................................................... H02K 11/04
See application file for complete search history.

(56) References Cited

U.S. PATENT DOCUMENTS

| 5,398,160 | A   | * | 3/1995  | Umeda ........................ 361/707 |
| 6,271,607 | B1  | * | 8/2001  | Vandenbossche .......... 310/68 D |
| 7,149,088 | B2  | * | 12/2006 | Lin et al. ....................... 361/704 |
| 7,224,145 | B2  | * | 5/2007  | Pierret et al. .................... 322/25 |
| 7,292,445 | B2  | * | 11/2007 | Linke .......................... 361/715 |
| 7,763,974 | B2  | * | 7/2010  | Takahashi et al. ............ 257/724 |
| 7,859,147 | B2  | * | 12/2010 | Dubuc et al. ................ 310/68 D |
| 7,932,649 | B2  | * | 4/2011  | Dubuc et al. ..................... 310/71 |
| 7,973,405 | B2  | * | 7/2011  | Takahashi et al. ............ 257/724 |
| 2004/0232538 | A1 | * | 11/2004 | Linke .......................... 257/686 |
| 2005/0280998 | A1 | * | 12/2005 | Lin et al. ....................... 361/704 |
| 2006/0175906 | A1 | * | 8/2006  | Hino et al. ........................ 310/1 |
| 2007/0008679 | A1 | * | 1/2007  | Takahasi et al. .............. 361/600 |
| 2010/0117225 | A1 | * | 5/2010  | Shiraishi et al. .............. 257/723 |
| 2011/0127888 | A1 | * | 6/2011  | Tunzini et al. ............. 310/68 D |

FOREIGN PATENT DOCUMENTS

| FR | 2 842 042 A1 | 1/2004 |
| FR | 2 886 477 A1 | 12/2006 |
| FR | 2 886 482 A1 | 12/2006 |

* cited by examiner

*Primary Examiner* — John K Kim
(74) *Attorney, Agent, or Firm* — Berenato & White, LLC

(57) ABSTRACT

An alternator includes a stator S, a rotor R and a transistor bridge, which form synchronous rectification. The synchronous rectification is in the form of an over-molded mechatronic housing (2), and the mechatronic housing includes an electronic power substrate (3) and power connection terminals (23), (24). Electronic chips (300A, 300B) are implanted on the electronic power substrate, and at least one of the power connection terminals is connected electrically to the electronic chip by means of at least a first soldered connection wire ($30_0$, $30_1$, $30_2$, $30_{B+}$, $30_{B-}$). According to one embodiment, the electronic power substrate is of the IMS, DBC or PCB type.

13 Claims, 4 Drawing Sheets

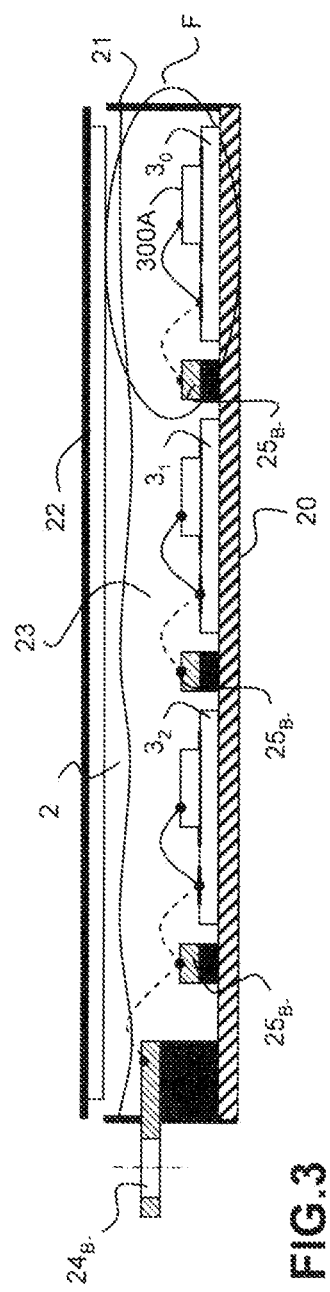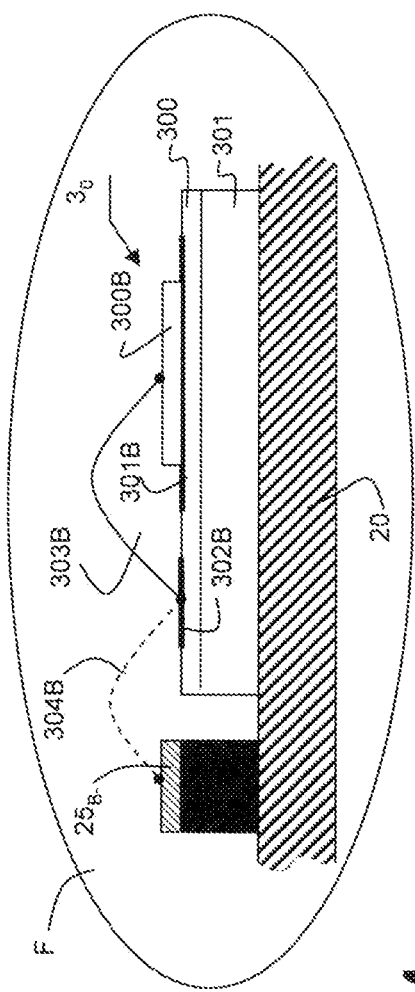

ALTERNATOR WITH SYNCHRONOUS RECTIFICATION EQUIPPED WITH AN IMPROVED ELECTRONIC POWER MODULE

This application is a US Utility Patent Application and claims priority to French Patent application Ser. No. 09/54588 filed Jul. 3, 2009.

FIELD OF THE INVENTION

The present invention relates in general to the field of rotary electrical machines, in particular for a motor vehicle. More particularly, the invention relates to an alternator with synchronous rectification which is equipped with an improved electronic power module.

BACKGROUND OF THE INVENTION

A rotary electrical machine of the alternator-starter type comprising electronic power means is known from FR-2886477B1. These electronic power means include a power transistor bridge of the MOSFET type, and provide a reversible analogue-digital (AC/DC) power converter function.

In the mode in which the rotary electrical machine is functioning as an alternator, the converter provides rectification of alternating phase voltages produced by the alternator into a direct supply voltage (typically 14 Volts) which supplies an on-board supply network of the vehicle. In the mode in which the rotary electrical machine is functioning as a motor/starter, the converter provides phase voltages which supply stator windings of the rotary electrical machine. Rotation of the rotor of the rotary electrical machine with sufficient mechanical torque is thus created, so as to assure the starting of the thermal engine of the vehicle. The phase voltages which are supplied are obtained by chopping, by means of the power transistor bridge, of the on-board supply network direct voltage (direct voltage supplied by an energy storage battery).

The electronic power means according to FR-2886477B1 comprises three identical bridge branch modules and a control module which incorporates a circuit of the ASIC type. The bridge branch modules each form a branch of the transistor bridge.

The architecture of the bridge branch module according to FR-2886477B1 is represented in FIG. 4C of this patent. MOSFET transistors, in the form of bare electronic chips, are soldered onto connection gates known as leadframes, which are over-moulded in a mechatronic housing. These leadframes are kept in position on a metal bearing plate by means of an electrically insulating plate which is sandwiched between the leadframes and the bearing plate. The insulating plate has properties of good thermal conduction, so as to transmit the calories which are generated by the electronic chips to a heat dissipater placed below the metal bearing plate of the module.

The technology disclosed by FR-2886477B1 has various applications in rotary electrical machines, and in particular gives very good results in terms of quality and performance, in its application to an alternator-starter.

In the context of reduction of emissions of $CO_2$ and the development of high-performance alternators, it is desirable to provide new technology which makes possible greater integration and reduction of costs.

SUMMARY OF THE INVENTION

The present invention relates to an alternator with synchronous rectification for a motor vehicle comprising a stator, a rotor and a transistor bridge, which form synchronous rectification means.

According to the invention, the synchronous rectification means are in the form of an over-moulded mechatronic housing, and the mechatronic housing comprises an electronic power substrate and power connection terminals, electronic chips being implanted on the electronic power substrate, and at least one of the power connection terminals being connected electrically to a said electronic chip by means of at least a first soldered connection wire.

According to a particular characteristic, the electronic power substrate is of the IMS, DBC or PCB type.

According to another particular characteristic, the electronic power substrate also comprises at least a first intermediate connection track, onto which there are soldered a second end of the first connection wire, the first end of the first connection wire being soldered onto the power connection terminal, as well as a first end of a second connection wire, the second end of the second connection wire being soldered onto the first electronic chip.

According to another particular characteristic, the electronic power substrate also comprises at least a second intermediate connection track, onto which there are soldered a first end of a third connection wire, the second end of the third connection wire being soldered onto a second electronic chip which is implanted on the electronic power substrate, as well as a first end of a fourth connection wire, the second end of the fourth connection wire being soldered onto a first power track of the mechatronic housing.

According to yet another particular characteristic, the electronic power substrate comprises at least a third track, onto which there are soldered an electronic chip and a first end of a fifth connection wire, the second end of the fifth connection wire being soldered onto a second power track of the mechatronic housing.

According to yet another characteristic, the first and second power tracks of the mechatronic housing are connected respectively to direct voltage power connection terminals.

According to a particular embodiment, the mechatronic housing contains a plurality of electronic power substrates with the same architecture.

According to a particular characteristic of this embodiment, each of the electronic power substrates comprises a transistor bridge branch formed by at least the first and second electronic chips.

Preferably, the mechatronic housing also contains a control circuit substrate which is connected electrically to each of the electronic power substrates via a connection bus comprising a plurality of bus tracks in each of the electronic power substrates, and a plurality of connection wires which are soldered between the plurality of bus tracks.

The invention provides the following advantages:
  Good mechanical isolation is provided between the power connection terminals and the inner structure of the mechatronic housing. The inner structure of the housing is protected against mechanical stresses on the power connection terminals, thus preventing any perforations at the level of the electrical insulators, or deterioration of the welds and soldering.
  The use of wires for connection with the terminals of the mechatronic housing permits production in two stages, thus limiting scrap. Once the substrate has been equipped, it is controlled. The integration in the mechatronic housing no longer comprises any delicate soldering on the chip, and the number of mechatronic housings which are scrapped decreases substantially.
  The power connection wires can be produced in a strip.
  The tracks onto which the ends of the connection wires are soldered do not require a precise location, since the use of connection wires permits self-adaptation and variability of the location of the tracks.

The cross-section of the dimensions of the connection wires can be such as to act as a fuse in the event of a short-circuit. The rotary electrical machine is thus protected upstream against any additional deteriorations.

The thermal insulation obtained between the stator (the temperature of which may reach 250° C.) of the rotary electrical machine and the electronic chips is improved by means of connection wires, in comparison with the technology which uses a leadframe. Maintenance of a reduced junction temperature is assisted by limiting the heat which rises from the stator windings to the silicon of the electronic chips.

Since the number of welds provided in the mechatronic housing is limited, taking into consideration the fact that the substrates are pre-equipped, it is possible to use a lower-class plastic over-moulding material for the mechatronic housing.

BRIEF DESCRIPTION OF THE DRAWINGS

Other aspects, objectives and advantages of the present invention will become more apparent from reading the following detailed description of a particular embodiment of it, provided by way of non-limiting example with reference to the attached drawings, in which:

FIG. 3 is a view in cross-section according to an axis BB of FIG. 1;

FIG. 4 is an enlargement of a portion F of FIG. 3;

DETAILED DESCRIPTION

Figure 5:
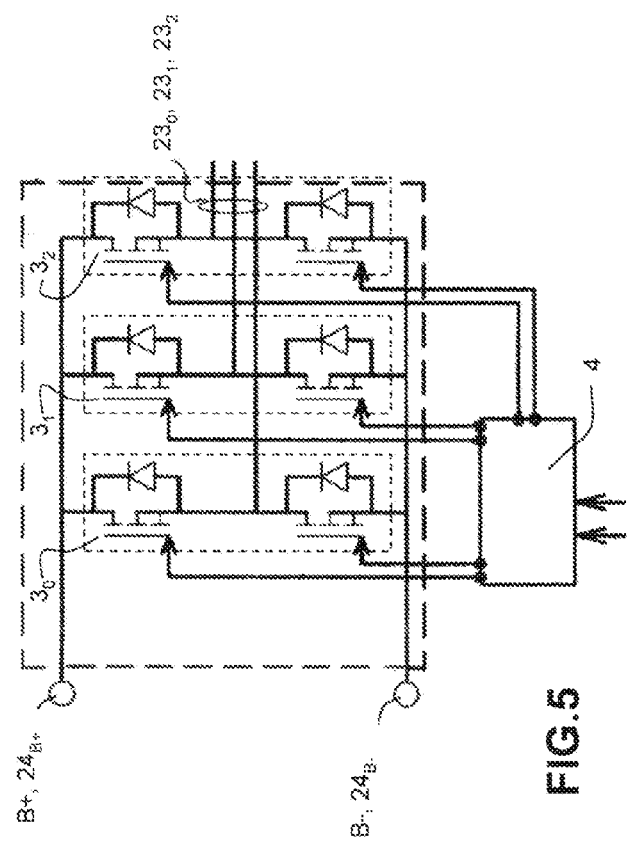
FIG. 5 represents the wiring diagram of the electronic power module in FIG. 1.
Figure 6:
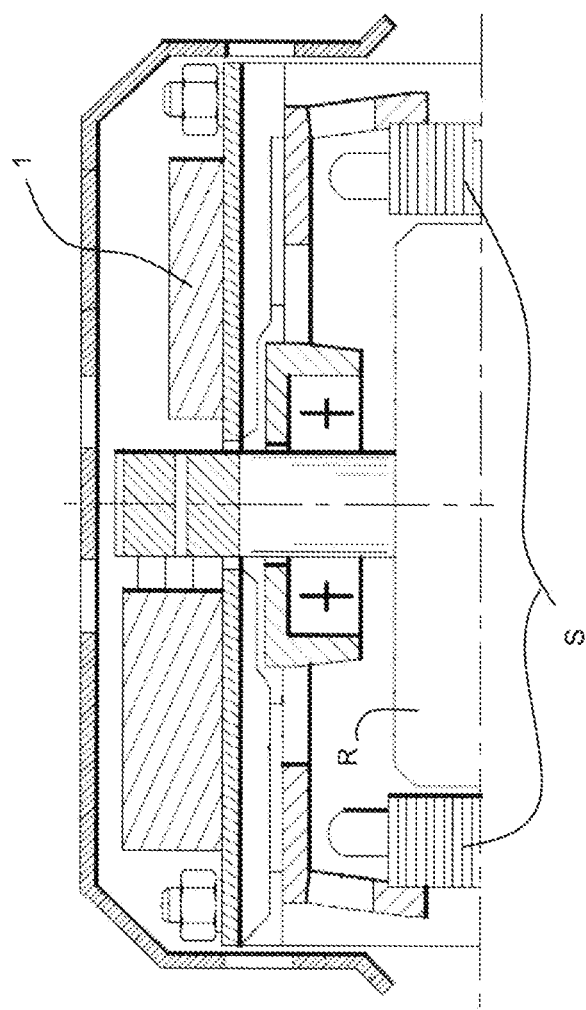
FIG. 6 shows the rear part in cross-section of a rotary electrical machine according to the invention, in the form of an alternator with synchronous rectification.

As shown in FIG. 5, the rotary electrical machine according to the invention comprises in a conventional manner a stator S and a rotor R and an electronic power module 1 according to the invention. A description will be provided firstly of the general architecture of an electronic power module 1, in a particular embodiment of the invention which concerns a three-phase alternator with synchronous rectification.

The wiring diagram of the module 1 in this particular embodiment of the invention is shown in FIG. 5.

As shown in FIG. 5, the module 1 comprises a transistor bridge $3_0$, $3_1$, $3_2$ and a control circuit 4.

The transistor bridge comprises six power transistors of the MOSFET type distributed in three bridge branches $3_0$, $3_1$, $3_2$. On their gate electrode, the MOSFET transistors each receive a respective control signal which is supplied by the circuit 4, and controls functioning of the transistors with synchronous rectification. A mid-point of each of the bridge branches $3_0$, $3_1$, $3_2$ is connected to a corresponding stator winding $23_0$, $23_1$, $23_2$ of the rotary electrical machine.

Figure 1:
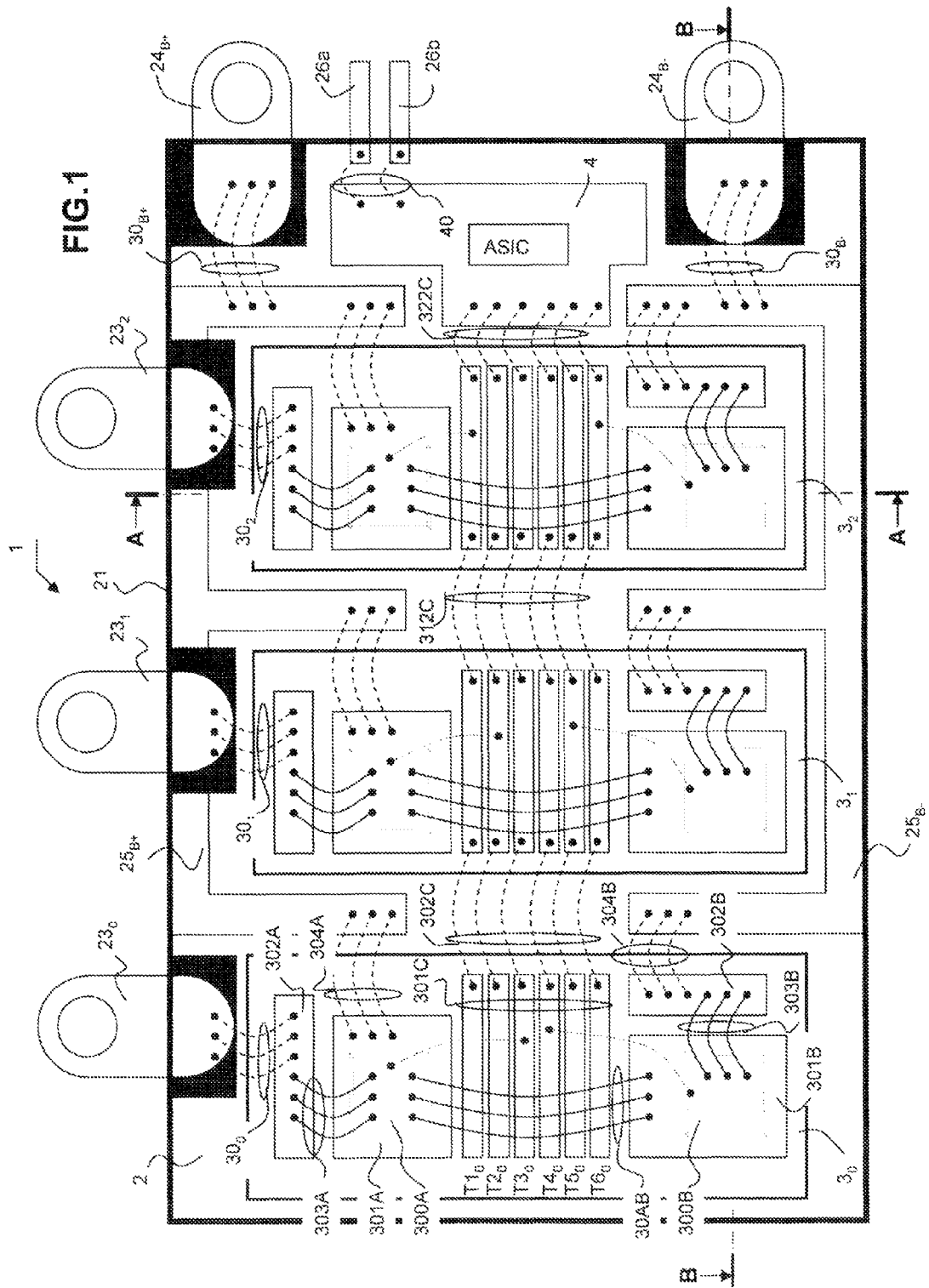
FIG. 1 is a plan view of an electronic power module contained in a rotary electrical machine according to the invention.

With reference to FIG. 1, the electronic power module 1 is produced in the form of an over-moulded mechatronic housing.

In this particular embodiment, the electronic module 1 comprises substantially the housing 2, three substrates $3_0$, $3_1$, $3_2$ equipped with bridge branches which correspond respectively to the three phases of the machine, and a control circuit substrate 4.

Figure 2:
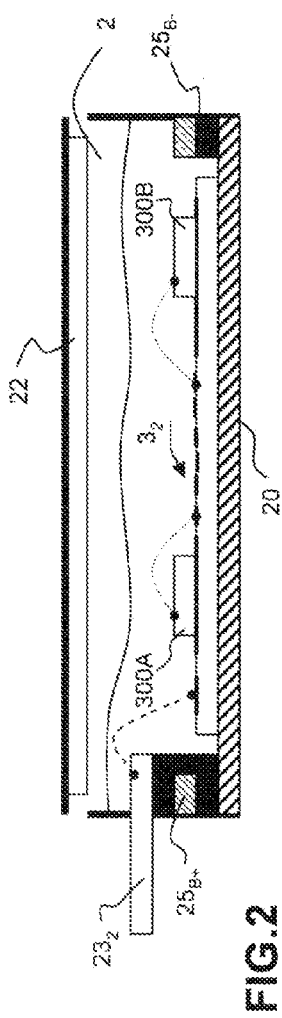
FIG. 2 is a view in cross-section according to an axis AA of FIG. 1.

The housing 2 substantially comprises a metal bearing plate 20, which for example is made of aluminium, and lateral walls 21 which are over-moulded on the periphery of the bearing plate 20 such as to form a housing structure. A cover 22 made of plastic material, which can be seen in FIGS. 2 and 3, is also provided such as to close the housing 2 during a final production step of the latter. The cover 22 is sealed on the ends of the walls 21 by being soldered or glued. Before the cover 22 is sealed, a filling gel 23 which can be seen in FIGS. 2 and 3 is poured into the housing 2, such as to cover the different sub-assemblies, thus assuring better mechanical retention and better protection.

The plastic which is used in the housing 2, both for the over-moulded parts and for the cover 22, can be selected in any quality standard which will withstand a maximum temperature of approximately 200° C.

The bearing plate 20, which is known as a bearing plate, is designed to be placed against a corresponding surface of a heat dissipater or radiator, and must therefore have very good thermal conduction.

Preferably, the bearing plate 20 will be covered with anti-corrosion protection, so as to prevent surface oxidation which can modify its heat-conduction characteristics.

The housing 2 is provided with power conduction tracks $25_{B+}$ and $25_{B-}$, with phase connection terminals $23_0$, $23_1$ and $23_2$, and with direct voltage connection terminals $24_{B+}$ and $24_{B-}$.

In this embodiment, as shown in FIG. 1, the power tracks $25_{B+}$ and $25_{B-}$ are in the form of an "E", and are disposed symmetrically opposite, on both sides of a longitudinal axis (not shown) of the housing 2.

The power tracks $25_{B+}$ and $25_{B-}$ participate in the interconnection of the substrates $3_0$, $3_1$ and $3_2$, to the direct voltage connection terminals $24_{B+}$ and $24_{B-}$, respectively.

The power tracks $25_{B+}$ and $25_{B-}$ are kept mechanically and electrically insulated by means of the over-moulding plastic.

The parts which are represented in black in the figures correspond to the over-moulding plastic.

Over-moulding plastic portions which are interposed between the tracks $25_{B+}$ and $25_{B-}$ and the bearing plate 20, and are shown in FIG. 3 for the track $25_{B-}$, isolate the tracks $25_{B+}$, $25_{B-}$ electrically from the bearing plate 20 and render them mechanically integral with the latter. As shown in FIGS. 1 and 2, the track $25_{B+}$ is embedded in the over-moulding plastic at the level of the phase connection terminals $23_1$ and $23_2$, such as to guarantee electrical insulation of the track $25_{B+}$ relative to the said terminals.

The phase connection terminals $23_0$, $23_1$ and $23_2$ permit electrical connection of the conductive wires at the end of the stator coils to the substrates $3_0$, $3_1$ and $3_2$ respectively. As shown in FIG. 2 for the terminal $23_2$ only, the terminals $23_0$, $23_1$ and $23_2$ pass through the lateral wall 21 obtained by over-moulding, and are retained mechanically by the over-moulded plastic portions interposed between them and the bearing plate 20.

The direct voltage connection terminals $24_{B+}$ and $24_{B-}$ permit connection of the tracks $25_{B+}$ and $25_{B-}$ to the direct voltage terminals B+ and B− of the rotary electrical machine, respectively. In the same manner as for the terminals $23_0$, $23_1$ and $23_2$, the terminals $24_{B+}$ and $24_{B-}$ pass through the lateral wall 21 obtained by over-moulding, and are retained mechanically by the plastic over-moulding portions interposed between them and the bearing plate 20.

According to the invention, the connection terminals $23_0$, $23_1$ and $23_2$ and $24_{B+}$ and $24_{B-}$ of the housing 2 are connected electrically to corresponding elements of the electronic module 1 by means of soldered bonding wires.

As shown in FIG. 1, in this embodiment, the terminals $23_0$, $23_1$ and $23_2$ are connected electrically to the substrates $3_0$, $3_1$ and $3_2$ by means of three groups of bonding wires $30_0$, $30_1$ and $30_2$, respectively. Each of the groups of bonding wires $30_0$, $30_1$ and $30_2$ comprises three wires. The terminals $24_{B+}$ and $24_{B-}$ are connected to the tracks $25_{B+}$ and $25_{B-}$ by means of groups of bonding wires $30_{B+}$ and $30_{B-}$, respectively. The groups of bonding wires $30_{B+}$ and $30_{B-}$ also each comprise three wires in this embodiment.

In general, the number of wires used for a connection and their diameter are determined on the basis of the intensity of the current which the connection must withstand, and the robustness required for the connection concerned.

As shown in FIG. 1, control terminals 26a and 26b also equip the housing 2. These terminals 26a, 26b which pass through the wall 21 are retained mechanically, in the same way as the other terminals, by the over-moulding plastic. A group of bonding wires 40, comprising two wires in this embodiment, connects the terminals 26a, 26b electrically to the substrate 4 of the control circuit.

The bridge arm substrates $3_0$, $3_1$ and $3_2$ will now be described in detail.

The bridge arm substrates $3_0$, $3_1$ and $3_2$ are electronic power substrates which in general can be derived from different technologies. Technologies of the type IMS, DBC or PCB (Insulated Metal Substrate, Direct Bonded Copper and Printed Circuit Board) can be used, depending on the applications.

According to one characteristic of the invention, the bridge arm substrates $3_0$, $3_1$ and $3_2$ are standard elements, and all three have the same architecture. The differences which exist between the three substrates lie substantially in the electrical interconnection. The substrate is described in detail hereinafter.

In this particular embodiment, the electronic power substrates are produced using IMS technology.

This technology is a good compromise for applications which dissipate energy, which is the case in this embodiment in which the electronic chips are power transistors of the MOSFET type which function as synchronous rectifiers.

As can be seen more particularly in FIGS. 1 to 4, the substrate $3_0$ comprises substantially two electronic chips 300A and 300B, a printed circuit 300, and a metal bearing plate 301.

The printed circuit 300 is a simple face printed circuit on a thin layer of epoxy resin of type FR4. The printed circuit 300 is placed and glued onto the metal bearing plate 301, which in this embodiment is made of aluminium. It will be appreciated that other materials which are good conductors of heat can be used for this metal bearing plate 301.

When the bridge arm substrate $3_0$ is fitted in the housing 2, the metal bearing plate 301 of the latter is placed against the metal bearing plate 20 of the housing 2, thus assuring good thermal contact for discharge of the heat released by the electronic chips 300A and 300B.

Metallised connection tracks and dots 301A, 301B, 302A, 302B and 301C are provided on the printed circuit 300.

The electronic chips 300A, 300B are glued or soldered respectively onto the connection tracks 301A, 301B.

The tracks 302A, 302B are intermediate connection tracks for connection of the chips 300A, 300B of the substrate $3_0$ to the housing 2, respectively.

According to the invention, the intermediate connection tracks 302A and 302B permit electrical connection of the substrate $3_0$ to the housing 2, without needing to carry out soldering on the chips. At this stage of production of the electronic module 1, a fault detected upon completion of implantation of the substrates $3_0$, $3_1$ and $3_2$ in the housing 2 would mean that the electronic module assembly 1 would have to be scrapped. Since soldering onto a chip is a delicate operation, the series of operations of soldering onto the chips of the substrate are carried out at the stage of production of the substrate, such that, if a fault is detected at the end of production of the substrate, it is only the faulty substrate which is scrapped, and not the electronic module assembly.

The track 302A is used for the electrical connection of the chip 300A to the terminal $23_0$ of the housing 2. This connection is obtained by means of the two groups of connection wires $30_0$ and 303A.

The group of connection wires $30_0$ is used to connect the terminal $23_0$ to the intermediate connection track 302A, and the group of connection wires 303A is used to connect the chip 300A to the intermediate connection track 302A.

A connection of this type with two groups of wires $30_0$ and 303A makes it possible to use different wires for the two groups. Thus, it is possible to have connection wires with a larger cross-section for the group $30_0$ compared with the group 303A, so as to make the connection between the terminal $23_0$ and the substrate $3_0$ more robust.

The track 302B is used for connection of the chip 300B to the conductive power track $25_{B-}$ of the housing 2. In the same way as the track 302A, the track 302B allows the substrate $3_0$ to be connected to the housing 2 without having to carry out soldering directly on the chip 300B. The connection between the chip 300B and the track 302B by the group of connection wires 303B is carried out at the stage of production of the substrate. The connection between the track 302B and the conductive power track $25_{B-}$ by the group of connection wires 304B is carried out at the stage of implantation of the substrate $3_0$ in the housing 2.

As shown in FIG. 1, a group of three connection wires 30AB connects the chips 300A and 300B. In addition, two groups of additional connection wires 304A and 302C are used to finish the connection of the substrate $3_0$ in the housing 2.

The group of connection wires 304A comprises three wires in this embodiment, and interconnects the connection track 301A to the conductive power track $25_{B+}$.

The group of connection wires 302C comprises six wires in this embodiment, and interconnects six tracks $T1_0$ to $T6_0$ for control signals of the substrate $3_0$ to six tracks $T1_1$ to $T6_1$ for corresponding control signals of the substrate $3_1$.

The substrates $3_1$ and $3_2$ are connected to the terminals $23_1$ and $23_2$ respectively, and to the conductive power tracks $25_{B+}$ and $25_{B-}$, in the same manner as the substrate $3_0$. The six tracks $T1_1$ to $T6_2$ for control signals of the substrate $3_1$ are interconnected to six tracks $T1_2$ to $T6_2$ for corresponding control signals of the substrate $3_2$ by a group of six connection wires 312C similar to the group 302C. The control signals bus formed by the connection of the tracks $T1_0$ to $T6_0$, $T1$ to $T6_1$ and $T1_2$ to $T6_2$ is connected to the control circuit 4 by a group of six connection wires 322C.

In this embodiment, the control circuit 4 is produced by means of an ASIC chip fitted onto a substrate. It will be appreciated that other techniques can be used, for example fitting of the ASIC chip onto ceramic.

As shown in FIG. 1, the bridge arm substrates $3_0$, $3_1$ and $3_2$ are individualised by their interconnection to the control signal bus formed by the interconnected tracks $T1_0$ to $T6_0$, $T1_1$ to $T6_1$ and $T1_2$ to $T6_2$. The chips of the substrate $3_0$ are each connected by a connection wire to the tracks $T3_0$ and $T4_0$ of the substrate $3_0$ respectively. The chips of the substrate $3_1$ are each connected by a connection wire to the tracks $T2_1$ and $T5_1$ of the substrate $3_1$ respectively. The chips of the substrate $3_2$ are each connected by a connection wire to the tracks $T1_2$ and $T6_2$ of the substrate $3_2$ respectively. These connections of the chips $3_0$, $3_1$ and $3_2$ to the control signal bus are preferably produced during the manufacture of the substrates, for the reasons previously indicated, because of the soldering on the chips.

It will be appreciated that the invention is not limited to the above-described particular embodiment. Other embodiments are possible according to the applications envisaged by persons skilled in the art, and remain within the scope of the appended claims.

The invention claimed is:

1. An alternator with synchronous rectification for a motor vehicle, the alternator comprising a stator (S), a rotor (R) and a transistor bridge forming synchronous rectification means comprising an over-moulded mechatronic housing (2); the mechatronic housing comprising:
    an electronic power substrate (3) disposed in the mechatronic housing;
    power connection terminals (23, 24) including phase connection terminals (23) and direct voltage connection terminals ($24_{B+}$, $24_{B-}$); and
    first and second electronic chips (300A, 300B) both implanted on the electronic power substrate (3);
    at least one of the power connection terminals connected electrically to the first electronic chip by means of at least a first soldered connection wire (30, 303A, 303B, 304A, 304B);
    the electronic power substrate (3) being one of the IMS, DBC and PCB type;
    the electronic power substrate ($3_0$) further comprising a first intermediate connection track (302A), onto which a second end of the first connection wire ($30_0$) is soldered;
    a first end of the first connection wire ($30_0$) soldered onto the power connection terminal ($23_0$), as well as a first end of a second connection wire (303A); and
    a second end of the second connection wire (303A) soldered onto the first electronic chip (300A).

2. The alternator with synchronous rectification according to claim 1, wherein the electronic power substrate ($3_0$) further comprises at least a second intermediate connection track (302B), onto which a first end of a third connection wire is soldered; wherein a second end of the third connection wire (303B) is soldered onto the second electronic chip (300B) implanted on the electronic power substrate ($3_0$), as well as a first end of a fourth connection wire; and wherein a second end of the fourth connection wire is soldered onto a first power track ($25_{B-}$) of the mechatronic housing (2).

3. The alternator with synchronous rectification according to claim 2, wherein the electronic power substrate ($3_0$) further comprises at least a third track (301A), onto which the first electronic chip (300A) and a first end of a fifth connection wire (304A) are soldered; and wherein a second end of the fifth connection wire (304A) is soldered onto a second power track ($25_{B+}$) of the mechatronic housing (2).

4. The alternator with synchronous rectification according to claim 3, wherein the first and second power tracks ($25_{B+}$, $25_{B-}$) of the mechatronic housing (2) are connected respectively to the direct voltage power connection terminals ($24_{B+}$, $24_{B-}$).

5. The alternator with synchronous rectification according to claim 1, wherein the mechatronic housing (2) comprises a plurality of electronic power substrates ($3_0$, $3_1$, $3_2$) with the same architecture; each of the electronic power substrates corresponding to one of phases of the alternator and disposed in the mechatronic housing (2).

6. The alternator with synchronous rectification according to claim 5, wherein each of the electronic power substrates ($3_0$, $3_1$, $3_2$) comprises a transistor bridge branch formed by the first and second electronic chips (300A, 300B).

7. The alternator with synchronous rectification according to claim 5, wherein the mechatronic housing (2) further comprises a control circuit substrate (4) connected electrically to each of the electronic power substrates ($3_0$, $3_1$, $3_2$) via a connection bus comprising a plurality of bus tracks (T1 to T6) in each of the electronic power substrates ($3_0$, $3_1$, $3_2$), and a plurality of connection wires (302C, 312C, 322C) which are soldered between the plurality of bus tracks.

8. An alternator with synchronous rectification for a motor vehicle, the alternator comprising a stator (S), a rotor (R) and a transistor bridge forming synchronous rectification means comprising an over-moulded mechatronic housing (2), the mechatronic housing comprising:
    an electronic power substrate (3) disposed in the mechatronic housing;
    power connection terminals (23, 24) including phase connection terminals (23) and direct voltage connection terminals ($24_{B+}$, $24_{B-}$);
    first and second electronic chips (300A, 300B) both implanted on the electronic power substrate (3); and
    a metal bearing plate (20) supporting the electronic power substrate (3), lateral walls (21) over-moulded on the periphery of the bearing plate (20) such as to form a housing structure and a cover (22) provided to close the housing (2);
    at least one of the power connection terminals connected electrically to the first electronic chip by means of at least a first soldered connection wire (30, 303A, 303B, 304A, 304B);
    the power connection terminals (23, 24) being electrically isolated from the bearing plate (20) and pass through the lateral walls (21).

9. The alternator with synchronous rectification according to claim 8, wherein the mechatronic housing (2) further comprises a filling gel (23) disposed inside the housing (2).

10. The alternator with synchronous rectification according to claim 8, wherein the bearing plate (20) is made of metal.

11. The alternator with synchronous rectification according to claim 10, wherein the cover (22) is made of plastic material.

12. The alternator with synchronous rectification according to claim 8, wherein the cover (22) is sealed on ends of the lateral walls (21).

13. The alternator with synchronous rectification according to claim 12, wherein the cover (22) is sealed on the ends of the lateral walls (21) by being soldered or glued.

* * * * *